(12) United States Patent
Nedovic et al.

(10) Patent No.: US 7,629,817 B2
(45) Date of Patent: Dec. 8, 2009

(54) SYSTEM AND APPARATUS FOR APERTURE TIME IMPROVEMENT

(75) Inventors: Nikola Nedovic, San Jose, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 11/960,290

(22) Filed: Dec. 19, 2007

(65) Prior Publication Data

US 2008/0191770 A1 Aug. 14, 2008

Related U.S. Application Data

(60) Provisional application No. 60/889,031, filed on Feb. 9, 2007.

(51) Int. Cl.
  *G01R 19/00* (2006.01)
(52) U.S. Cl. .................. 327/55; 327/57; 327/211; 327/215
(58) Field of Classification Search ............ 327/55, 327/57, 201, 202, 211, 212, 215
  See application file for complete search history.

(56) References Cited

U.S. PATENT DOCUMENTS

| | | | | |
|---|---|---|---|---|
| 4,004,284 A | * | 1/1977 | Heeren | 365/222 |
| 5,289,055 A | * | 2/1994 | Razavi | 326/126 |
| 5,396,125 A | * | 3/1995 | Wong | 326/126 |
| 5,986,494 A | * | 11/1999 | Kimura | 327/359 |
| 6,025,736 A | * | 2/2000 | Vora et al. | 326/39 |
| 6,472,920 B1 | * | 10/2002 | Cho et al. | 327/215 |
| 6,798,249 B2 | * | 9/2004 | Wong et al. | 326/115 |
| 7,084,683 B1 | * | 8/2006 | Nix | 327/203 |
| 7,375,568 B2 | * | 5/2008 | Amamiya | 327/218 |
| 7,382,175 B2 | * | 6/2008 | Maruyama et al. | 327/359 |

OTHER PUBLICATIONS

M. Matsui, H. Hara, Y. Uetani, K. Lee-Sup, T. Nagamatsu, Y. Watanabe, A. Chiba, K. Matsuda, T. Sakurai, "A 200 MHz 13 mm$^2$ 2-D DCT macrocell using sense-amplifying pipeline flip-flop scheme", IEEE Journal of Solid-State Circuits, vol. 29, n. 12, p. 1482-1490, Dec. 1994.

(Continued)

*Primary Examiner*—Kenneth B. Wells
(74) *Attorney, Agent, or Firm*—Baker Botts L.L.P.

(57) ABSTRACT

In particular embodiments, an apparatus includes a first transistor connected at the gate to a first input signal voltage and a second transistor connected at the gate to a second input signal voltage. The apparatus further includes a deactivation element coupled to the transistors, the deactivation element being operable to deactivate the first and second transistors by selectively transmitting a deactivation current to a first terminal of the first transistor and a second terminal of the second transistor thereby raising a voltage on the first and second terminals to a value large enough to deactivate the first and second transistors. In particular embodiments, activating the first or second transistor transmits a signal from the apparatus and deactivating the first and second transistors prevents the signal from being transmitted from the apparatus.

19 Claims, 3 Drawing Sheets

OTHER PUBLICATIONS

J. Cao et al., "OC-192 transmitter and receiver in standard 0.18- μm CMOS", IEEE Journal of Solid-State Circuits, vol. 37, No. 12, p. 1768-1780, Dec. 2002.

J. Rogers, J. Long, "A 10-Gb/s CDR/DEMUX With *LC* Delay Line VCO in 0.18-μm CMOS", IEEE Journal of Solid-State Circuits, vol. 37, No. 12, p. 1781-1789, Dec. 2002.

J. Lee, B. Razavi, "A 40-Gb/s clock and data recovery circuit in 0.18-μm CMOS technology", IEEE Journal of Solid-State Circuits, vol. 38, No. 12, p. 2181-2190, Dec. 2003.

A. Ong et al., "A 40-43 Gb/s clock and data recovery IC with integrated SFI-5 1:16 demultiplexer in SiGe technology", IEEE Journal of Solid-State Circuits, vol. 38, No. 12, p. 2155-2168, Dec. 2003.

M. Megheli, et al., "A 0.18μm SiGe BiCMOS Receiver and Transmitter Chipset for SONET OC-768 Transmission Systems," ISSCC p. 230, Feb. 2003.

A. Koyama, et al., "43Gb/s Full-Rate-Clock 16:1 Multiplexor and 1:16 Demultiplexor with SFI-5 Interface in SiGe BiCMOS Technology," ISSCC, p. 232, Feb. 2003.

J. Yen, et al., "A Fully Integrated 43.2Gb/s Clock and Data Recovery and 1:4 DEMUX IC in InP HBT Technology," ISSCC, p. 240, Feb. 2003.

Y. Okaniwa et al., "A 0.11 μm CMOS clocked comparator for high-speed serial communications", Symp. on VLSI Circuits, p. 198-201, Jun. 2004.

J. Lee, "High-speed circuit designs for transmitters in broadband data links", IEEE Journal of Solid-State Circuits, vol. 41, No. 5, p. 1004-1015, May 2006.

\* cited by examiner

SYSTEM AND APPARATUS FOR APERTURE TIME IMPROVEMENT

CROSS REFERENCE TO RELATED APPLICATIONS

This application claims the benefit under 35 U.S.C. § 119(e) of U.S. Provisional Application No. 60/889,031, entitled "Improving the Aperture Time Using High Gain Sense Amplifiers with Better Latching in Current Mode Sampling and Decisions Circuits," filed Feb. 9, 2007.

TECHNICAL FIELD

The present disclosure relates generally to signal processing and more particularly to a system and apparatus for aperture time improvement.

BACKGROUND

In digital signal processing, an input signal may be sampled by a sampling circuit at a particular sampling frequency. The sampling frequency is defined as the number of samples of the input signal obtained in one second (measured in hertz). If enough samples are taken of the input signal over a given period of time (e.g., if the sampling frequency of the sampling circuit is high enough), then the input signal may be reconstructed using the samples. In particular embodiments, the sampling frequency may be dependent upon the circuitry employed by the sampling circuit to obtain the samples of the input signal. For example, if the circuitry employed by the sampling circuit cannot operate at a high enough frequency to accommodate a particular input signal (e.g., if the sampling circuit cannot take samples fast enough to account for the data changes in the input signal), then a portion of the data contained in the input signal may be lost or damaged during the sampling. Consequently, "maximum frequency of operation" may be one of the performance metrics used to gauge the operational ability of a sampling circuit.

As the maximum frequency of operation of a sampling circuit increases, the samples of an input signal are compressed closer to one another in time. Ideally, samples of the input signal represent "snapshots" of individual point values along the input signal at particular moments in time. As an example and not by way of limitation, if a sampling circuit were to obtain samples of an input signal using a series of perfect impulses (e.g., using a dirac comb), then each sample would represent a single, mutually exclusive, point along the input signal. However, the ability to obtain perfectly discrete samples of an input signal may be limited by the operational ability of the sampling circuit. As an example and not by way of limitation, the aperture time of the sampling circuit (e.g., the temporal width of each sample obtained by the sampling circuit) may not be instantaneous due to various operational constraints inherent in the sampling circuit such as operational delays associated with particular circuit topologies or delays associated with the operation of particular electrical components of the circuit. Consequently, "aperture time" may be another performance metric used to gauge the operational ability of a sampling circuit.

DESCRIPTION OF EXAMPLE EMBODIMENTS

Overview

In particular embodiments, a system includes a latch and a sense amplifier. The latch includes a first latch transistor configured to connect at its gate to a first input signal voltage and a second latch transistor configured to connect at its gate to a second input signal voltage. The latch further includes a deactivation element coupled to the latch transistors. The deactivation element is operable to deactivate the first and second latch transistors by selectively transmitting a deactivation current to a first terminal of the first latch transistor and a second terminal of the second latch transistor thereby raising a voltage on the first and second terminals to a value large enough to deactivate the first and second latch transistors. When the first or second latch transistors are activated, a sample is transmitted from the latch to the sense amplifier. When the first and second latch transistors are deactivated, transmission of the sample from the latch to the sense amplifier is prevented. In particular embodiments, the sense amplifier includes a first sense amplifier transistor connected at its gate to a first input sample voltage associated with the sample and a second sense amplifier transistor connected at its gate to a second input sample voltage associated with the sample. The sense amplifier further includes a third sense amplifier transistor connected at its gate to a first output signal voltage associated with an output signal and a fourth sense amplifier transistor connected at its gate to a second output signal voltage associated with the output signal. In particular embodiments, the first, second, third, and fourth sense amplifier transistor are coupled together and operable to simultaneously compare the input sample voltages and the output signal voltages, and the sense amplifier transistor having the highest signal voltage connected at its gate is operable to create the output signal by deactivating the remaining transistors. Furthermore, the output signal corresponds to the sample.

Description

Figure 1:
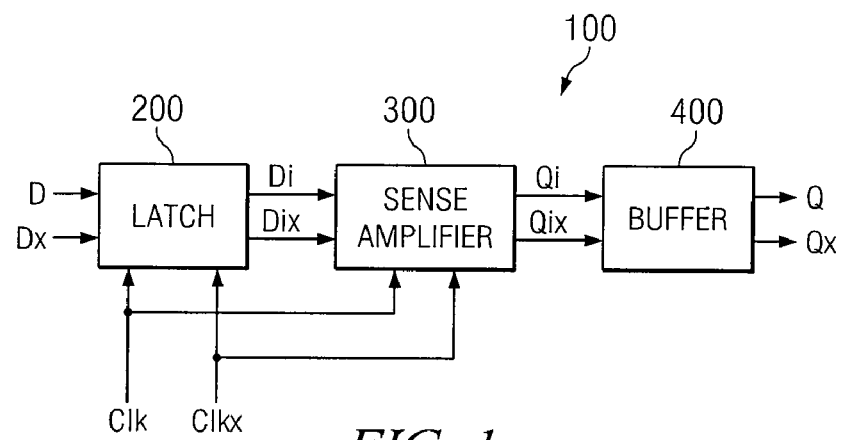
FIG. 1 illustrates an example system for aperture time improvement according to an example embodiment of the present disclosure.

FIG. 1 illustrates an example system 100 for aperture time improvement. System 100 includes a latch 200, a sense amplifier 300, and a buffer 400. Latch 200 may act in conjunction with sense amplifier 300 and buffer 400 to provide a sampling circuit with a low aperture time for sampling an input signal. In particular embodiments, an input signal received by system 100 may consist of an input signal D and a complimentary input signal Dx. In particular embodiments, data may be encoded onto the input signal by temporarily adding or subtracting pulses of voltage (e.g., +/−0.3 volts) to either of signals D or Dx, which may, in turn, be interpreted as either a logical "1s" or "0s". As an example and not by way of limitation, for a particular bit of data, if the voltage of signal D is "high" relative to the voltage of signal Dx (e.g., signal D=1.3 volts and Dx=1.0 volts) then that particular bit may correspond to a logical "1". As an additional example and not by way of limitation, if the voltage of signal Dx is "high" relative to the voltage of signal D (e.g., signal Dx=1.3 volts and D=1.0 volts) then that particular bit may correspond to a logical "0".

In particular embodiments, a signal may degrade during transmission or may otherwise be received by system 100 in less than perfect form (e.g., the relative voltage difference between signals D and Dx may be less than the nominal voltage value of +/−0.3 volts). System 100 may receive, sample, and reconstruct a degraded input signal (e.g., a series of degraded bits) into an output signal containing a corresponding series of reconstructed bits at, around, or above nominal values. As an example and not by way of limitation, for a particular bit, the relative voltage difference between signal D and signal Dx may have degraded to 0.1 volt (e.g., signal D=1.1 volts and signal Dx=1.0 volts), system 100 may sample the degraded bit and output a corresponding bit at a nominal voltage of 0.3 volts (e.g., signal D=1.3 volts and signal Dx=1.0 volts). One of ordinary skill in the art will appreciate that the above-described values for the common voltage and the nominal voltages were presented for the sake of explanatory simplicity and will further appreciate that the present disclosure contemplates the use of any suitable value for the common voltage and the nominal voltages. One of ordinary skill in the art will further appreciate that above-described use of system 100 for signal recovery was presented solely for the purpose of explanatory simplicity and will further appreciate that the present disclosure contemplates the use of system 100 for any suitable signal processing purpose.

Each component of system 100 may perform a particular function in the process of sampling an input signal. As an example and not by way of limitation, latch 200 may isolate a sample voltage ("a sample") of each bit. In particular embodiments, the speed at which system 100 can sample an input signal (e.g., the sampling frequency of system 100) may be affected by the speed at which latch 200 can isolate a sample of each bit in the input signal. As an example and not by way of limitation, the aperture time of system 100 may depend, in part, upon the aperture time of latch 200 (e.g., how quickly latch 200 can change from transparent to opaque and vice versa). Once latch 200 has isolated a particular sample, latch 200 becomes opaque, thereby inhibiting the voltage of the sample from changing. As described more fully below, shortening the time that it takes for latch 200 to turn from transparent to opaque shortens the temporal width of each sample that will later be processed by other components of system 100. Because samples may begin to overlap with one another as the sampling frequency is increased, shortening the temporal width of each sample may allow system 100 to operate at a higher frequency.

After being isolated by latch 200, each sample is fed into a sense amplifier 300. Signals Di and Dix therefore represent the samples obtained by latch 200. In particular embodiments, sense amplifier 300 may receive a particular sample with an underdeveloped voltage (e.g., the voltage difference between signal Di and signal Dix may be less than nominal values). Sense amplifier 300 may evaluate the underdeveloped sample and may output a corresponding output signal at or above the nominal voltage. As an example and not by way of limitation, sense amplifier 300 may receive a particular sample with a voltage difference of 0.1 volts (e.g., Di=1.1 volts and Dix=1.0 volts). Sense amplifier 300 may evaluate the particular sample and output a corresponding output signal with a voltage difference of 0.3 volts (e.g., Qi=1.3 and Qix=1.0 volts); thereby raising the voltage of the sample to nominal values. Because the period of evaluation at sense amplifier 300 may affect the operating speed (e.g., the frequency of operation) of system 100, shortening the evaluation time of each sample at sense amplifier 300 may allow system 100 to operate at a higher frequency.

Figure 2:
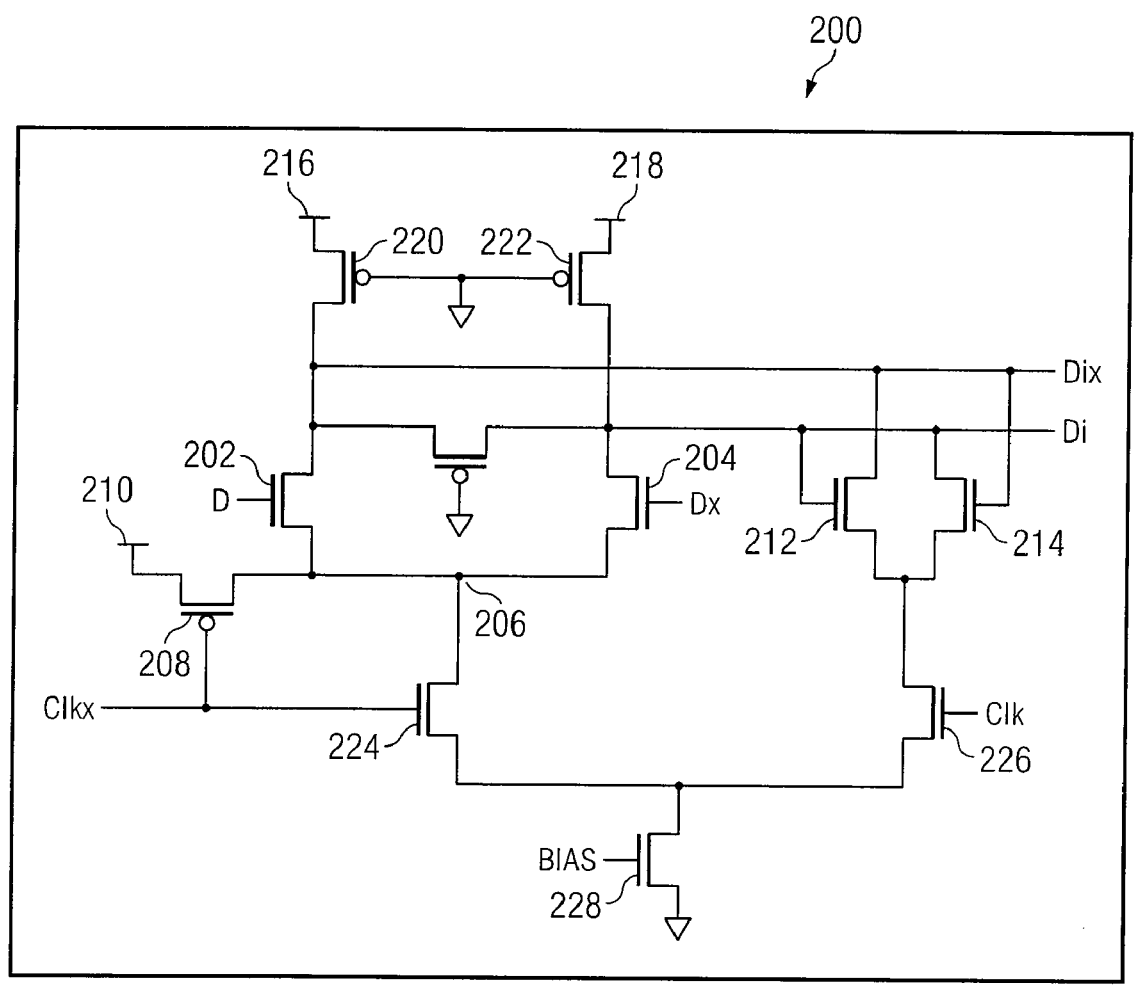
FIG. 2 illustrates an example latch that may be used in the system for aperture time improvement of FIG. 1 according to an example embodiment of the present disclosure.
Figure 3:
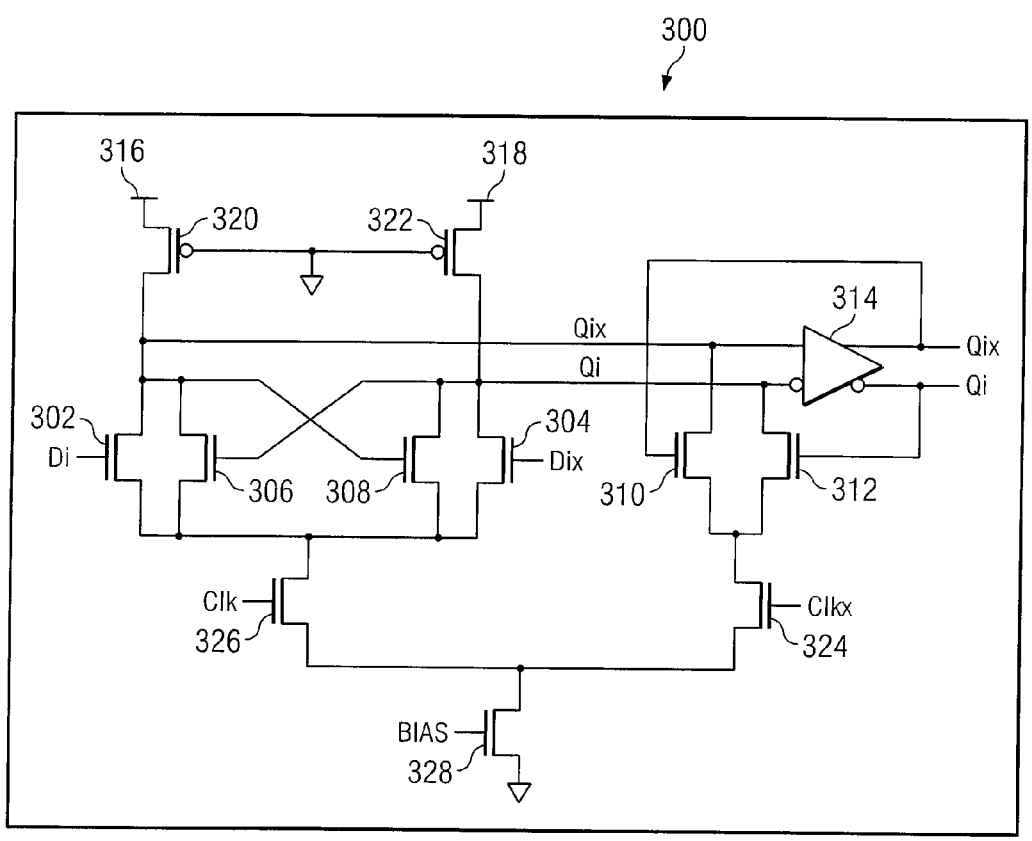
FIG. 3 illustrates an example sense amplifier that may be used in the system for aperture time improvement of FIG. 1 according to an example embodiment of the present disclosure.

In particular embodiments, sense amplifier 300 turns "on" and begins evaluating the voltage of the particular sample only after latch 200 has become opaque. By waiting until latch 200 becomes opaque before activating sense amplifier 300, system 100 ensures that the voltage of the sample will not change during the period of evaluation by sense amplifier 300. In order to achieve a sampling scheme whereby latch 200 remains opaque while sense amplifier 300 is evaluating, the operation of particular components of sense amplifier 300 and latch 200 may be respectively controlled by a clock signal Clk and a complimentary clock signal Clkx operating at opposite phases (e.g., one is "on" while the other is "off"). As an example and not by way of limitation, particular components of latch 200 may be controlled by clock signal Clk and complimentary clock signal Clkx through a pair of clock-controlled transistors 224 and 226 (FIG. 2). Similarly, particular components of sense amplifier 300 may be controlled by clock signal Clk and complimentary clock signal Clkx through a pair of clock-controlled transistors 324 and 326 (FIG. 3).

After being evaluated by sense amplifier 300, the samples are output to a buffer 400. Signals Qi and Qix therefore represent the samples as they have been evaluated by sense amplifier 300 (e.g., signals Qi and Qix represent signals Di and Dix at nominal voltage). Buffer 400 transforms the intermediate output signal Qi and its complement Qix into a corresponding output signal Q and a complementary output signal Qx. In particular embodiments, buffer 400 may be a conventional two-stage CML buffer. In particular embodiments, a bias voltage may be fed to particular components of system 100 through a bias transistor (e.g., transistor 228 in FIG. 2 or transistor 328 in FIG. 3). One of ordinary skill in the art will appreciate that the above-described functionality and interrelation of the components of system 100 have been presented for the purpose of explanatory simplicity and will further appreciate that the present disclosure contemplates the use or substitution of any components of system 100 for use in other systems in other applications that may or may not include signal sampling or processing.

FIG. 2 illustrates an example embodiment of latch 200 according to the present disclosure. Latch 200 may be any device or element or combination of two or more devices or elements capable of isolating sample voltages associated with an input signal. In particular embodiments, latch 200 may include a differential pair of n-type metal-oxide-semiconductor (NMOS) field-effect transistors 202 and 204, the gates of which may be respectively coupled to an input signal D or a complimentary input signal Dx. When transistors 202 and 204 are activated (e.g., by the clock signal Clkx through transistor 224), latch 200 may output a corresponding sample (e.g., signals Di and Dix). When transistors 202 and 204 are deactivated, a pair of keeper transistors 212 and 214 may hold the value of the outputs (e.g., signals Di and Dix) of latch 200 that was established at the time of deactivation of transistors 202 and 204. In particular embodiments, keeper transistors 212 and 214 form a positive feedback to maintain the value of latch 200 in the off-phase. In particular embodiments, the current associated with the output sample (e.g., signals Di and Dix) may be supplied to latch 200 from a pair of voltage sources 216 and 218 coupled to latch 200 through a pair of resistive transistors 220 and 222. In particular embodiments, the respective source terminals of differential transistors 202 and 204 may each be coupled to a common source node 206. One of ordinary skill in the art will appreciate that the voltage at source node 206 may affect the speed at which input transistors 202 and 204 turn "off" (e.g., the speed at which transistors 202 and 204 transition from conductive to nonconductive). One of ordinary skill in the art will further appreciate that turning input transistors 202 and 204 off renders latch 200 opaque.

In particular embodiments, a deactivation element 208 may be coupled to node 206 whereby a current may be selectively delivered to node 206. By selectively delivering current to node 206, deactivation element 208 may be used to control the time needed for input transistors 202 and 204 to turn off. As an example and not by way of limitation, deactivation element 208 may be triggered by clock signal Clk (or complimentary clock signal Clkx) to deliver current to node 206 at approximately the moment when sense amplifier 300 turns on and begins evaluating a sample. By delivering a current (e.g., a "deactivation current") to node 206 when sense amplifier 300 turns on and begins evaluating a sample, deactivation element 208 may quickly raise the voltage at node 206 to a value large enough to turn off input transistors 202 and 204 (e.g., to a voltage above the "high" voltage of the input signal minus the threshold voltage of the input transistor), thereby quickly isolating the sample from further input voltage changes during evaluation by sense amplifier 300. In particular embodiments, supplying a deactivation current to node 206 using deactivation element 208 may enable input transistors 202 and 204 to turn off faster than would be possible if deactivation element 208 were not present.

Deactivation element 208 may be any active device or element or combination of two or more such devices or elements capable of supplying or transmitting current to node 206. As examples and not by way of limitation, deactivation element 208 could be a bipolar junction transistor ("BJT"), a junction gate field-effect transistor ("JFET"), or other suitable transistor or switch. As an additional example and not by way of limitation, deactivation element 208 may be a clock-controlled p-type metal-oxide-semiconductor (pMOS) field-effect transistor, the drain of which is coupled to node 206, the source of which is coupled to a current source 210, and the gate of which is coupled to a complementary clock signal Clkx. In particular embodiments, deactivation element 208 may be coupled to clock Clkx such that when clock Clkx goes low, deactivation element 208 is turned on, thereby raising voltage at node 206 so as to turn off input transistors 202 and 204 at approximately the moment when sense amplifier 300 begins evaluating a sample. Once the voltage at node 206 increases to a value large enough to shut off input transistors 202 and 204 (e.g., to a voltage above the high voltage of the input signal minus the threshold voltage), the sample is isolated from the input signal and further changes of the input signal (e.g., signals D and Dx) may have no effect on the voltage of the particular sample being evaluated. By employing deactivation element 208 to quickly charge the parasitic capacitance at node 206 in order to quickly shut off transistors 202 and 204, the hold time of latch 200 and, consequently, the aperture of system 100 may be improved. One of ordinary skill in the art will appreciate that the above-described configuration of latch 200 was presented for the sake of explanatory simplicity and will further appreciate that the present disclosure contemplates using any suitable number of components and nodes to achieve a system whereby current may be selectively delivered to the source terminals (or other equivalent terminals) of the input transistors of latch 200 in order to influence the response time of the input transistors.

FIG. 3 illustrates an example embodiment of sense amplifier 300 according to the present disclosure. Sense amplifier 300 may be any device or element or combination of two or more such devices or elements capable of amplifying the initially sensed voltage of a sample received from latch 200. In particular embodiments, sense amplifier 300 may include a pair of input nMOS transistors 302 and 304, the gates of which may be respectively coupled to signals Di and Dix. In particular embodiments, sense amplifier 300 may include a pair of output nMOS transistors 306 and 308, the gates of which may be respectively coupled to signals Qi and Qix. In particular embodiments, transistors 302 and 304 may be coupled to transistors 306 and 308 (e.g., transistors 306 and 308 may be respectively "cross coupled" to transistors 304 and 302) such that the voltages respectively associated with each input sample and each output signal (e.g., the voltages respectively associated with signals Di, Dix, Qi, and Qix) are simultaneously compared with one another during the evaluation period of each particular sample. In particular embodiments, during the time when sense amplifier 300 is inactive, the feedback consisting of a buffer 314 and a pair of reset transistors 310 and 312 pre-sets the nodes Qi and Qix to the common mode voltage of the nodes Di and Dix. Pre-setting the voltage on the nodes Qi and Qix to the common mode voltage of the nodes Di and Dix may provide an effective starting point for comparison once sense amplifier 300 is activated. In particular embodiments, when clock Clk switches high, sense amplifier 300 turns on and transistors 302, 304, 306, and 308 become active. When transistors 302, 304, 306, and 308 become active, they may act in conjunction with one another to begin amplifying the voltage of a sample (e.g., the voltage difference between signals Di and Dix). In turn, as the voltage difference between Di and Dix is amplified, the voltage difference between Qi and Qix will be affected (e.g., amplified) accordingly. As described in more detail below, transistors 302, 304, 306, and 308 are coupled such that, as a sample is evaluated, the particular transistor associated with the highest voltage will take more and more of the sample current until the remaining three transistors deactivate. By deactivating the remaining transistors, the sense amplifier 300 may output an output signal (e.g., signals Qi and Qix) corresponding to the sample. In particular embodiments, the current associated with the output sample (e.g., signals Qi and Qix) may be supplied to sense amplifier 300 from a pair of voltage sources 316 and 318 coupled to sense amplifier 300 through a pair of resistive transistors 320 and 322. In particular embodiments, the output signal corresponding to the sample (e.g., signals Qi and Qix) may be amplified by buffer 314 before leaving sense amplifier 300. By coupling transistors 302, 304, 306, and 308 together such that signals Di, Dix, Qi, and Qix are simultaneously compared with one another until only the transistor associated with the highest voltage remains active, sense amplifier 300 may be enabled to evaluate a sample faster than a sense amplifier wherein only the input signals are compared with one another. Hence, by simultaneously comparing the voltages of the input signals and the output signals with one another, the aperture time of sense amplifier 300 may be improved relative to sense amplifiers wherein only the voltages of the input signals are compared with one another.

In particular embodiments, sense amplifier 300 may evaluate and reconstruct a weak sample. As an example and not by way of limitation, the voltage of a particular sample received by sense amplifier 300 may be less than a nominal voltage of 0.3 volts. For example, the voltage difference of the sample may only be 0.1 volts (e.g., the voltage of signal Di may be 1.1 volts and the voltage of signal Dix may be 1.0 volts), and the nodes Qi and Qix may be pre-set to 1.05 volts. Once the sample is received by sense amplifier 300, sense amplifier 300 may begin simultaneously comparing the input voltages associated with the sample (e.g., signals Di and Dix) and the output voltages associated with the corresponding output signal (e.g., signals Qi and Qix) with one another using transistors 302, 304, 306, and 308. As mentioned above, transistor 302 may be associated with signal Di, transistor 304 may be associated with signal Dix, transistor 306 may be associated with signal Qi, and transistor 308 may be associated with signal Qix. As the voltages are compared with one another, whichever transistor is associated with the highest voltage will take an increasingly larger portion of the tail current until the remaining three transistors are deactivated. As an example and not by way of limitation, if the voltage of signal Di is slightly higher than the voltage of signal Dix, then this small voltage disparity between the input signals will be reflected accordingly as a voltage difference between the output signals Qi and Qix.

Since the operation of transistors 306 and 308 are respectively governed by the voltages of signals Qi and Qix, an increase of the voltage signal Qi over the voltage of signal Qix will make transistor 306 more conductive than transistor 308. When transistor 306 becomes more conductive than transistor 308, transistor 306 will begin "stealing" current from transistor 308, thereby rendering transistor 308 less conductive. In turn, as transistor 306 becomes more conductive relative to transistor 308, the voltage of signal Qi will proportionally increase over the voltage of signal Qix. As the voltage disparity between signals Qi and Qix increases, transistor 306 will continue to become more conductive as transistor 308 becomes less conductive until transistor 308 finally becomes nonconductive. Additionally, as transistor 306 becomes more and more conductive due to the growing voltage associated with signal Qi, transistor 306 may take current from transistors 302 and 304 until transistors 302 and 304 become nonconductive. For example, once the voltage on transistor 302 (e.g., the voltage of signal Di) is surpassed by the voltage on transistor 306 (e.g., the voltage of signal Qi), then transistor 306 will begin taking current away from the gate of the transistor 302. Additionally, once the voltage on the gate of the transistor 304 (e.g., the voltage of signal Dix) is surpassed by the voltage on the gate of the transistor 306 (e.g., the voltage of signal Qi), then transistor 306 may begin taking current away from transistor 304. In particular embodiments, transistor 306 may take current away from transistors 302, 304, and 308 until transistors become inactive.

By connecting the input and output transistors together such that the particular transistor associated with the highest voltage is enabled to take current away from the remaining input and output transistors until the remaining transistors deactivate, sense amplifier 300 may be enabled to achieve full switching. Additionally, by connecting the input and output transistors together such that the particular transistor associated with the highest voltage is enabled to take current away from the remaining input and output transistors until the remaining transistors deactivate, sense amplifier 300 may achieve higher gain, more sensitivity, and a quicker response time than a sense amplifier wherein only the input voltages associated with a sample are compared.

As an additional example and not by way of limitation, if sense amplifier 300 receives a particular sample with a voltage at or above a nominal voltage of 0.3 volts (e.g., if the voltage difference between Di and Dix is 0.3 volts), then the voltage of the sample may be large enough to initially steer the entire current to either input transistor 302 if signal Di is high or to input transistor 304 if signal Dix is high. One of ordinary skill in the art will appreciate that the above-described example was presented for the sake of explanatory simplicity and will further appreciate that the present disclosure contemplates connecting any suitable elements (e.g., BJTs, MOSFETs, or other suitable transistors) together in any suitable configuration in sense amplifier 300 to achieve a scenario wherein the voltages of each input signal and output signal are simultaneously compared with one another and wherein the particular element associated with the highest voltage draws current from the remaining elements until the remaining elements deactivate.

In particular embodiments, transistors 302, 304, 306, and 308 may share a constant current source. During the reset phase of sense amplifier 300 (e.g., when sense amplifier 300 is turned off), transistors 302, 304, 306, and 308 may be rendered inactive (e.g., turned off) by clock Clk. At the same time when transistors 302, 304, 306, and 308 are turned off by clock Clk, reset transistors 310 and 312 may be activated (e.g., turned on) by clock Clkx and the constant current source may be steered to reset transistors 310 and 312. By steering the current source to reset transistors 310 and 312 during the reset phase of sense amplifier 300, sense amplifier 300 may use negative feedback to reset the voltage of the signals Qi and Qix to a common voltage. In particular embodiments, the common voltage of signals Qi and Qix may be the same as the common voltage of signals D and Dx. In particular embodiments, resetting the voltage of signals Qi and Qix to a common voltage may aid in reducing the history effect in sense amplifier 300 (e.g., the effect of previous decisions made by sense amplifier 300 on a future decision to be made by sense amplifier 300).

Figure 4:
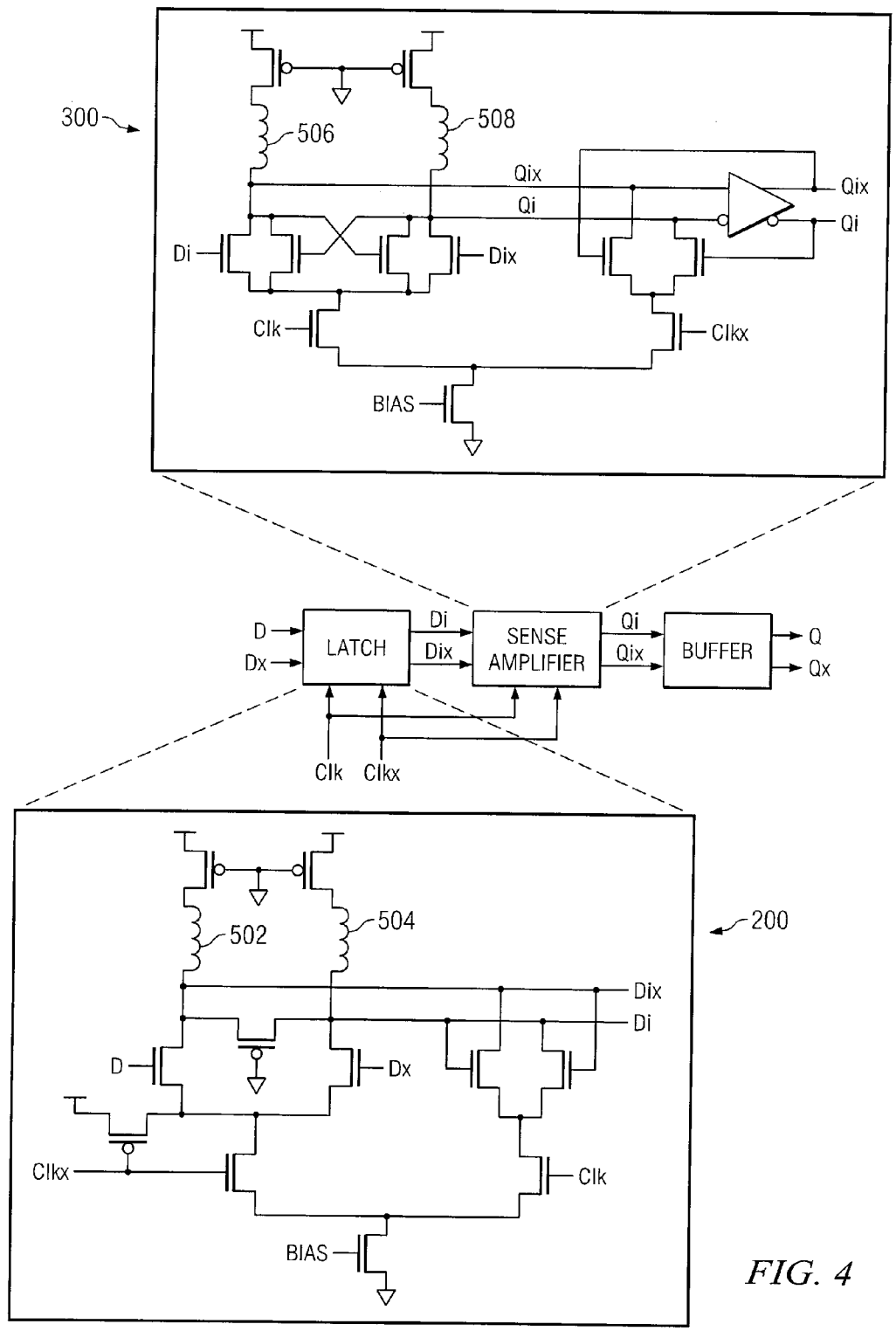
FIG. 4 illustrates an example system for aperture time improvement including shunt inductors according to an example embodiment of the present disclosure.

FIG. 4 illustrates a modified embodiment of system 100 which includes a plurality of inductors 502-508 operable to increase the bandwidth of system 100 using inductive shunt peaking. One of ordinary skill in the art will appreciate that either or both latch 200 and sense amplifier 300 may include shunt inductors to supply additional current to the respective component transistors of latch 200 and sense amplifier 300, thereby allowing the component transistors to turn off faster. By supplying additional current to the nodes Di and Dix of latch 200 and/or nodes Qi and Qix of sense amplifier 300, shunt inductors 502-508 may increase the bandwidth of latch 200 or sense amplifier 300 over latches or sense amplifiers that do not include shunt inductors 502-508.

Although particular steps of the present disclosure are described and illustrated as occurring in a particular order, the present disclosure contemplates any suitable steps of occurring in any suitable order. Moreover, although particular components of FIG. 1 are described and illustrated as executing particular steps in the present disclosure, the present disclosure contemplates any suitable components executing any suitable steps.

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend.

What is claimed is:

1. An apparatus, comprising a latch and a sense amplifier wherein:

the latch comprises:

a first transistor connected at the gate to a first input signal voltage;

a second transistor connected at the gate to a second input signal voltage;

a deactivation element coupled to the transistors, the deactivation element being operable to deactivate the first and second transistors by selectively transmitting a deactivation current to a first terminal of the first transistor and a second terminal of the second transistor thereby raising a voltage on the first and second terminals to a value large enough to deactivate the first and second transistors; and wherein:

activating the first or second transistor transmits a signal sample from the latch to the sense amplifier; and deactivating the first and second transistors prevents the signal sample from being transmitted from the latch; and the sense amplifier comprises:

a first sense amplifier transistor configured to receive at the gate a first input signal sample voltage;

a second sense amplifier transistor configured to receive at the gate a second input signal sample voltage;

a third sense amplifier transistor configured to receive at the gate a first output signal sample voltage;

a fourth sense amplifier transistor configured to receive at the gate a second output signal sample voltage; wherein:

the first, second, third, and fourth sense amplifier transistor are coupled together and operable to simultaneously compare the input signal sample voltages and the output signal sample voltages; and a pair of reset transistors, the reset transistors being operable to reset the first output signal sample voltage and the second output signal sample voltage to a common level; wherein:

the first, second, third, and fourth sense amplifier transistors are activated by a first clock signal;

the reset transistors are activated by a second clock signal; and the first clock signal is complementary to the second clock signal.

2. The apparatus of claim 1, wherein:

a first signal sample is transmitted from the latch when the first input signal voltage is higher than the second input signal voltage; and a second signal sample is transmitted from the latch when the second input signal voltage is higher than the first input signal voltage.

3. The apparatus of claim 1, further comprising a pair of keeper transistors, the keeper transistors being operable to maintain a voltage associated with the signal when the first and second transistors are deactivated.

4. The apparatus of claim 1, wherein the deactivation element comprises an active device.

5. The apparatus of claim 1, wherein the deactivation element comprises a p-type metal-oxide-semiconductor (pMOS) field-effect transistor.

6. The apparatus of claim 1, wherein the deactivation element couples the first and second terminals to a current source, the deactivation element operable to:

when active, transmit the deactivation current from the current source to the first and second terminals;

when inactive, prevent the deactivation current from passing from the current source to the first and second terminals; and wherein:

a first clock signal activates the deactivation element.

7. The apparatus of claim 1, wherein:

the first and second terminals comprise source terminals.

8. The apparatus of claim 1, wherein:

the transistors comprise n-type metal-oxide-semiconductor (NMOS) field-effect transistors.

9. The apparatus of claim 3, wherein:

the first and second transistors are activated by a first clock signal;

the keeper transistors are activated by a second clock signal; and the first clock signal is complementary to the second clock signal.

10. The apparatus of claim 1, wherein:

the first and second transistors comprise nMOS transistors;

the deactivation element comprises a pMOS transistor;

a first drain terminal of the first transistor is coupled to a first voltage source terminal;

a first source terminal of the first transistor is coupled to a drain of the deactivation element;

a second drain terminal of the second transistor is coupled to a second voltage source terminal;

a second source terminal of the second transistor is coupled to the drain of the deactivation element;

the deactivation element is connected at the gate to a first clock signal, the first clock signal being operable to activate the deactivation element;

a source terminal of the deactivation element is coupled to a current source; and the deactivation element, when active, is operable to transmit the deactivation current from the current source to the first and second source terminals.

11. An apparatus, comprising:

a first transistor configured to receive at the gate a first input signal voltage;

a second transistor configured to receive at the gate a second input signal voltage;

a third transistor configured to receive at the gate a first output signal voltage;

a fourth transistor configured to receive at the gate a second output signal voltage; wherein:

the first, second, third, and fourth transistor are coupled together and operable to simultaneously compare the input signal voltages and the output signal voltages; and a pair of reset transistors, the reset transistors being operable to reset the first output signal voltage and the second output signal voltage to a common level; wherein:

the first, second, third, and fourth transistors are activated by a first clock signal;

the reset transistors are activated by a second clock signal; and the first clock signal is complementary to the second clock signal.

12. The apparatus of claim 11, wherein:

the third and fourth transistors comprise output transistors; and the transistor connected at the gate to the highest input signal voltage is operable to create an output signal corresponding to an input signal by decreasing the current flowing through each of the remaining transistors of the first, second, third, and fourth transistors except itself and one of the output transistors.

13. The apparatus of claim 11, wherein:

the first and second input signal voltages are associated with the input signal;

the first and second input signal voltages are not at nominal levels;

the first and second output signal voltages are associated with the output signal;

the first and second output signal voltages are output from the apparatus at generally nominal levels; and the output signal corresponds to the input signal.

14. The apparatus of claim 12, wherein the transistor connected at the gate to the highest input signal voltage is operable to decrease the current flowing through the remaining transistors of the first, second, third, and fourth transistors except itself and the one of the output transistors by drawing current away from those transistors until they generally cease conducting current.

15. The apparatus of claim 14, wherein the transistor connected at the gate to the highest input signal voltage and the one of the output transistors are operable to conduct more current as the remaining transistors conduct less current.

16. The apparatus of claim 11, wherein the transistors comprise n-type metal-oxide-semiconductor (NMOS) field-effect transistors.

17. A system, comprising:

a latch, the latch comprising:
  a first latch transistor configured to connect at the gate to a first input signal voltage;
  a second latch transistor configured to connect at the gate to a second input signal voltage;
  a deactivation element coupled to the latch transistors, the deactivation element being operable to deactivate the first and second latch transistors by selectively transmitting a deactivation current to a first terminal of the first latch transistor and a second terminal of the second latch transistor thereby raising a voltage on the first and second terminals to a value large enough to deactivate the first and second latch transistors; and wherein:
    activating the first or second latch transistor transmits a sample from the latch to a sense amplifier;
    deactivating the first and second latch transistors prevents the sample from being transmitted from the latch to the sense amplifier and the sense amplifier, comprising:
  a first sense amplifier transistor configured to receive at the gate a first input sample voltage associated with the sample;
  a second sense amplifier transistor configured to receive at the gate a second input sample voltage associated with the sample;
  a third sense amplifier transistor configured to receive at the gate a first output signal voltage associated with an output signal;
  a fourth sense amplifier transistor configured to receive at the gate a second output signal voltage associated with the output signal; wherein:
    the first, second, third, and fourth sense amplifier transistor are coupled together and operable to simultaneously compare the input sample voltages and the output signal voltages;
    the output signal corresponds to the sample; and
    the latch transistors are configured to be active when the sense amplifier transistors are inactive, and inactive when the sense amplifier transistors are active.

18. The system of claim 17, wherein the sense amplifier transistors are configured to:

be active when the latch transistors are inactive;

be inactive when the latch transistors are active.

19. The system of claim 17, wherein:

the first and second input signal voltages are associated with an input signal;

the first and second input signal voltages are not at nominal levels;

the first and second output signal voltages are output from the system at nominal levels; and the output signal corresponds to the input signal.

\* \* \* \* \*